United States Patent [19]

Hintz et al.

[11] Patent Number: 5,460,853
[45] Date of Patent: Oct. 24, 1995

[54] SYSTEM AND METHOD FOR MULTILAYER FILM PRODUCTION ON TAPE SUBSTRATE

[75] Inventors: Michael B. Hintz, Mahtomedi; Joseph H. Sexton, Oakdale; William C. Mitchell, Arden Hills; John W. Ulseth, Roseville, all of Minn.

[73] Assignee: Minnesota Mining and Manufacturing Company, St. Paul, Minn.

[21] Appl. No.: 248,579

[22] Filed: May 24, 1994

Related U.S. Application Data

[63] Continuation of Ser. No. 898,034, Jun. 12, 1992, abandoned.

[51] Int. Cl.⁶ .................................................... C23C 16/00
[52] U.S. Cl. .................. 427/255.5; 427/131; 427/132; 427/251; 118/729
[58] Field of Search ............................. 427/255.7, 251, 427/255.5, 131, 132; 118/729

[56] References Cited

U.S. PATENT DOCUMENTS

| | | |
|---|---|---|
| 4,013,539 | 3/1977 | Kuehnle . |
| 4,220,117 | 9/1980 | Shinohara ............................ 427/132 |
| 4,303,489 | 12/1981 | Morrison . |
| 4,454,836 | 6/1984 | Akashi et al. ........................ 118/730 |
| 4,543,301 | 9/1985 | Yazawa et al. ....................... 427/132 |
| 4,576,699 | 3/1986 | Sato et al. . |
| 4,643,915 | 2/1987 | Arai et al. ........................... 427/132 |
| 4,670,356 | 6/1987 | Sato et al. . |
| 4,690,857 | 9/1987 | Shirahata et al. .................... 427/132 |
| 4,727,005 | 2/1988 | Sato . |
| 4,735,698 | 4/1988 | Nomura et al. . |
| 4,876,159 | 10/1989 | Shin . |
| 4,929,320 | 5/1990 | Yamada et al. . |
| 4,939,715 | 7/1990 | Vogelgesang et al. . |
| 4,994,305 | 2/1991 | Yamanaka et al. .................. 427/251 |
| 5,298,282 | 3/1994 | Sugita et al. ......................... 427/132 |

FOREIGN PATENT DOCUMENTS

0263380A2  4/1988  European Pat. Off. .
0367685    5/1990  European Pat. Off. .
0367685A2  5/1990  European Pat. Off. .
2005249    1/1992  Japan .

OTHER PUBLICATIONS

"Punching and Assembly of Scrolled Sheet Material", p. 64, *Automatic Assembly Technique*, Jun., 1986.

Sato, *Magnetic Properties of Amorphous Tb–Fe Thin Films With an Artificially Layered Structure*, pp. 2514–2520, J. Appl. Phys., vol. 59, No. 7 (1986); (no month available).

Shin, S. C., *Dependence of Microstructure and Magneto–Optical Properties on Deposition Angle in Evaporated TbFe and TbFeCo Films*, J. Appl. Phys. pp. 3340–3342, vol. 61, No. 8 (1987) (no month available).

Shin, S. C., *High Performance Magneto–Optical TbFeCo Disks Prepared by Coevaporation*, pp. 288–290, Appl. Phys. Lett., vol. 51, No. 4 (1987); (no month available).

Senda, M., et al, *Magnetic Properties of Fe/SiO₂ Multilayer Film*, pp. 1238–1242, J. Appl. Phys., vol. 65, No. 3 (1989) (no month available).

Krishnan, R., et al., *Torque and Kerr Rotation Studies in Amorphous $Tb_{20}Fe_{80}/Al_2O_3$ Multilayers*, pp. 333–336, Journal of Magnetism and Magnetic Materials, vol. 78, (1989); (no month available).

Thornton, J., *Internal Stresses in Titanium, Nickel, Molybdenum, and Tantalum Films Deposited by Cylindrical Magnetron Sputtering*, pp. 164–168, J. Vac. Sci. Technol., vol. 14, No. 1, (1977).

(List continued on next page.)

*Primary Examiner*—Shrive Beck
*Attorney, Agent, or Firm*—Gary L. Griswold; Walter N. Kirn; Eric D. Levinson

[57] ABSTRACT

A method of sequential deposition of source materials onto a web substrate. A substrate transfer mechanism imparts continuous movement of a substrate past a plurality of deposition sources during vapor deposition of deposition source materials. Every portion of the substrate is exposed to deposition fluxes from the deposition sources in an alternating periodic manner. The number of source exposures is greater than the number of sources.

3 Claims, 5 Drawing Sheets

OTHER PUBLICATIONS

Maissel, L. I., et al, editors, *Handbook of Thin Film Technology*, pp. 8–3 to 8–43, 17–33 to 17–44, 12—33 to 12–40, 5–22, McGraw Hill, New York, (1970); (no month available).

Thornton, J. A., *High Rate Thick Film Growth*, pp. 239–260, Ann., Rev. Mater, Sci., vol. 7 (1977) (no month available).

SYSTEM AND METHOD FOR MULTILAYER FILM PRODUCTION ON TAPE SUBSTRATE

This is a continuation of application Ser. No. 07/898,034, filed Jun. 12, 1992, now abandoned.

FIELD OF THE INVENTION

This invention relates to the manufacture of thin films having a multilayered structure. More particularly, this invention relates to a continuous coating method and system for depositing a multilayered thin film onto a web substrate.

BACKGROUND OF THE INVENTION

Within the field of vapor deposited thin film production, it is well known that film properties depend upon film microstructure. For certain applications, film structures comprising layers of differing composition which repeat in a periodic fashion have desirable properties; such structures will be referred to herein as "multilayered structures" or "multilayers".

Optical coatings consisting of periodically alternating layers of high refractive index and low refractive index dielectric materials are examples of technically useful multilayered structures in which optical properties can be tuned to a particular application by appropriately selecting certain features, for example, the number of layer periods and layer thickness. Magnetic or magneto-optical recording materials are further examples of materials in which a multilayered structure can be utilized to alter or optimize thin film properties. For example, deposition of alternating thin (typically ≦1 nanometer) layers of Fe and Tb can be used to produce a magneto-optical recording material; a Fe-Tb film of, e.g. 50 nm thickness would thus typically consist of 25 or more Fe-Tb layer pairs. By varying the Fe and Tb layer thickness, magnetic properties such as coercivity and anisotropy can be controlled.

Multilayer deposition methods described in the prior art employ some mechanical means to expose substrates to two or more deposition source fluxes in a repetitive, sequential manner, and the deposition sources are typically operated continuously. Apparatus based on the above methods are used for multilayer deposition on discrete, non-continuous substrates.

SUMMARY OF THE INVENTION

The invention discloses a method of sequential deposition of source materials onto a surface of a web substrate. Substrate transfer means imparts continuous movement of the substrate past a plurality of deposition sources facing the substrate. During vapor deposition, every portion of the substrate surface is exposed to deposition fluxes from the deposition sources in an alternating periodic manner. The number of alternating source exposures is greater than the number of sources.

The invention also discloses a continuous coating method for depositing a multilayered structure onto a web substrate. Web transfer means imparts continuous movement of the web substrate past a plurality of deposition sources facing the substrate. During vapor deposition of the deposition source materials, a multilayered structure is created on the web substrate. The number of layers is greater than the number of deposition sources.

The invention also discloses a device for manufacturing a web substrate having a multilayered structure. A deposition source region is configured to contain a plurality of deposition sources facing a web substrate supported by a web substrate transfer means. Web substrate transfer means provides support for the web substrate and imparts continuous movement to the web past a deposition source region to produce, during vapor deposition, a multilayered structure on the web substrate. The number of layers in the multilayered structure is greater than the number of deposition sources.

The invention further comprises a multilayer thin film on a web substrate. A plurality of deposition source material layers are deposited onto a web substrate to form the multilayered thin film structure. The number of layers in the structure exceeds the number of deposition sources providing source materials.

The invention further comprises a multilayer thin film on a web substrate. The web substrate has a designated surface for receiving multiple layers of deposition source materials. A plurality of deposition source material layers is deposited onto the web substrate to form a multilayered thin film structure in which each layer is at an inclined angle to the designated surface.

DETAILED DESCRIPTION OF THE INVENTION

The invention comprises novel methods, apparatus, and resulting products relating to continuous coating of substrates to produce a multilayered structure on the substrates. More particularly, the substrates comprise continuous tape or web substrates, dual references which are used interchangeably herein. A web substrate is defined as a flexible substrate with a width much greater than its thickness and a length much greater than its width. The tape or web substrates referred to may comprise substrates which are elongated, and substantially continuous. In this respect, at least one of the dimensions of the web substrates may be greater than the largest dimension of the deposition system employed.

Figure 1:
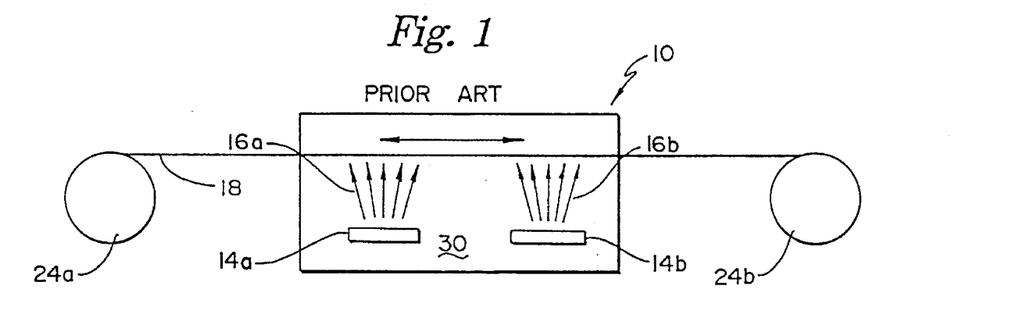
FIG. 1 is a schematic depiction of a prior art system for depositing source materials onto a web sheet substrate.

Referring to FIG. 1, an exemplary prior art coating system 10 is shown. Coating system 10 is used to provide deposition of source materials from deposition sources 14a and 14b onto substrate 18. Substrate 18 may comprise a web sheet substrate. In operation, substrate 18 is moved past deposition sources 14a, 14b so that during the deposition procedure substrate 18 is exposed to the deposition source material fluxes 16a, 16b, thereby depositing the source materials onto a portion of substrate 18. Devices similar to coating system 10 have various limitations when used for the production of multilayered structures. Some of these limitations include slow coating speeds, surface contamination, and/or reaction problems, wherein both of the latter two problems result from the elapsed time between layer deposition and/or contact with the web backside during repetitive winding and unwinding of the coated web. In particular, these limitations arise from using a tape transfer subsystem which comprises a roller or drum set. As schematically shown in FIG. 1, rollers 24a, 24b operate in the manner of a conventional supply and takeup reel. In order to produce a multilayered structure with this system, having a number of layers greater than the number of deposition sources, it is necessary to shuttle substrate 18 back and forth between rollers 24a and 24b and through deposition chamber 30 until the required number of layers are coated onto substrate 18. Representative prior art coating system 10 does not provide a continuous movement of substrate 18, but rather it involves shuttling substrate 18 between a movement cycle and a temporary stop cycle at which point the roller direction is reversed to enable a return of substrate 18 to the other roller, thereby drawing the substrate past deposition sources 14a, 14b to add yet another layer onto substrate 18.

Thus, as illustrated in FIG. 1, the synthesis of large area multilayered structures on web substrates is typically accomplished in known coating systems by repetitively moving the substrate back and forth from one deposition source to the next. This method is not well suited for the production coating of multilayered films onto webs. Rather, the deposition is preferably completed with a minimal number of passes, preferably one, through the coating machine without stopping to reverse the web direction. What is needed therefore is a continuous tape coating method for depositing multilayered structures onto a tape substrate. A particular commercial need includes deriving an efficient method of manufacturing a multilayered magneto-optical recording film on a tape substrate. It is believed that devices, such as disclosed herein, which employ the continuous deposition concept are novel for the production of multilayers.

Figure 2:
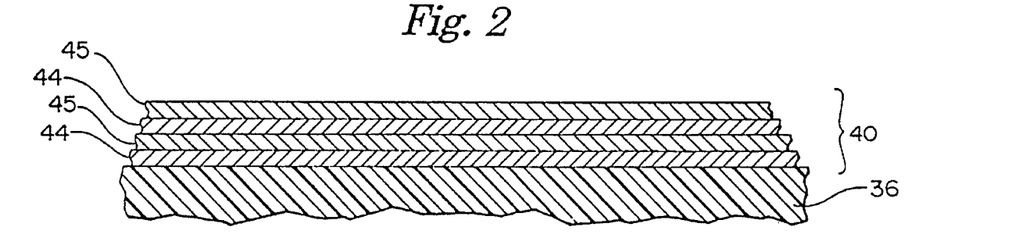
FIG. 2 is a vertical sectional view of a substrate and multilayered structure thereon.

Referring to FIG. 2, one example of a product manufactured according to the processes and structures of this invention is disclosed. The embodiment of FIG. 2 comprises a tape substrate 36 having deposition layering 40 vacuum deposited thereon. More particularly, deposition layering 40 comprises a multilayered structure further comprising individual layers 44, 45 shown, representatively, as multiple repeat layers. It is appreciated that the periodicity, thickness, composition, and overall number of the layers described and illustrated may vary considerably. Moreover, each of the layers comprising deposition layering 40, and comprising the tape substrate 36, may comprise either organic, inorganic, or combined organic/inorganic materials.

Figure 3:
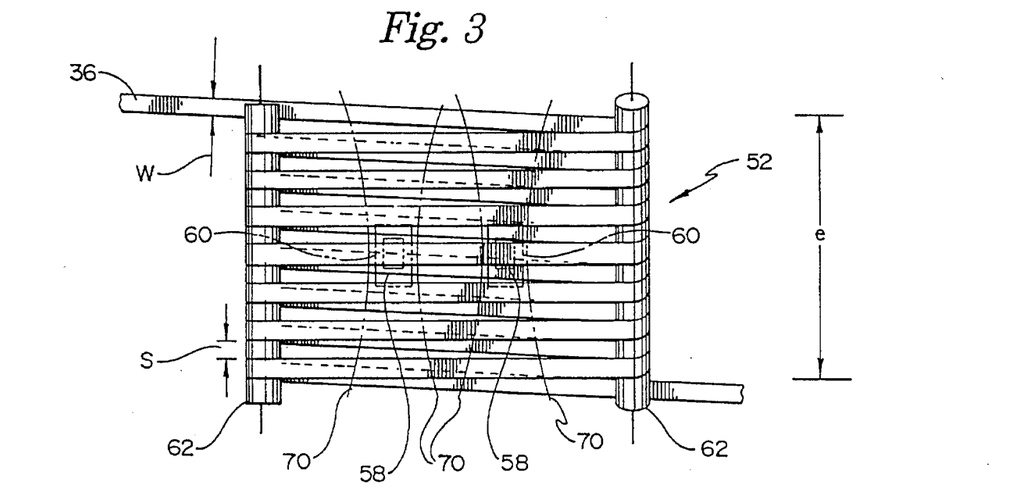
FIG. 3 is a plan view of one embodiment of the system invention comprising a plurality of rollers.

FIG. 3 is a plan view of one embodiment of a device for manufacturing a tape article having a multilayered coating. The manufacturing device or system 52 comprises a plurality of deposition sources 60. Each source 60 is constructed and arranged for holding deposition source materials 58, such as rare earth metals, other inorganics, transition metals, or organics, which are suitable for physical vapor deposition onto a continuously moving tape substrate 36. Tape transfer means 62 is provided for imparting continuous movement to tape substrate 36 in order to move tape substrate 36 past the plurality of deposition sources 60 during physical vapor deposition. Shielding means is preferably provided for limiting and defining the deposition of source materials onto designated areas of tape substrate 36. More particularly, shielding means comprises deposition flux shielding 70 representatively shown and located adjacent sources 60. In relation to the embodiment illustrated in FIG. 3, an analogous end elevation view of FIG. 4 illustrates a backspray shielding 74 configured to prevent unwanted deposition of source material vapor flux 16c, 16d onto a back surface of tape substrate 36.

Coating system 52 permits deposition of a high quality multilayered structure onto a narrow web or tape substrate at high speed. One example of the use of coating system 52 is for the production of magneto-optical recording tape. As illustrated in FIG. 3, the narrow web or tape substrate 36 is guided onto tape transfer means 62 at an angle so that tape substrate 36 can be wrapped around the respective components of the tape transfer means a number of times. This number depends upon the web width, w, the spacing between the various web strands, s, and the extent, e, of the source fluxes perpendicular to the direction of web motion. Web substrate 36 passing over tape transfer means 62 will be exposed to the source vapor fluxes approximately $e/(w+s)$ times before passing off tape transfer means 62 to either the next coating source(s) or a takeup reel.

Figure 4:
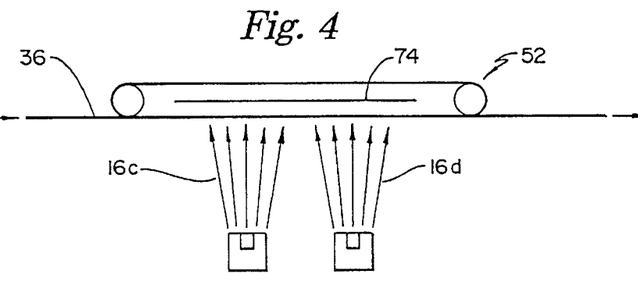
FIG. 4 is an end elevation view of the invention analogous to that depicted in FIG. 3.

The following comprises one example of laboratory scale coater complexity and throughput utilizing the invention embodiment disclosed in FIGS. 2–4. The assumptions for this example include:

1) A web width, w, approximately 1.2 cm;

2) A separation between web strands, s, of 0.3 cm;

3) A structure repeat distance (period), d, of 1 nm;

4) A flux extent/source perpendicular to the web motion, e, of approximately 15 cm;

5) A thickness, h, of 30 nm for the active magneto-optical layer;

6) Separate rare earth and transition metal sources; and

7) An effective coating rate/single strand pass, r, of 20 nm/second for a source pair over an aperture, a, of 10 cm (for each source) along the direction of web motion.

The number of passes, n, through the vapor flux per source pair is then approximately $e/(w+s)=10$. In this example, 30 ($h/d=30$) layer pairs are required to achieve the desired thickness; consequently, three sets of rare earth and transition metal sources are required. The flux exposure time required to deposit one period of the structure on the web is $d/r$ and the web must travel the distance a during this time, so:

$$v=(a\ r)/d=2 \text{ meters per second}$$

where v is the web velocity. The above example represents a very conservative estimate of web velocity, in that it is probable that the product (a r) could be increased by an order of magnitude or more relative to the assumed values. Further, it should be noted that the nominal ≦1 nm structural repeat distance typical of multilayered magneto-optical materials is an extreme example. Also, wider webs and less complex web handling may be possible for products with larger structural periods.

Figure 5:
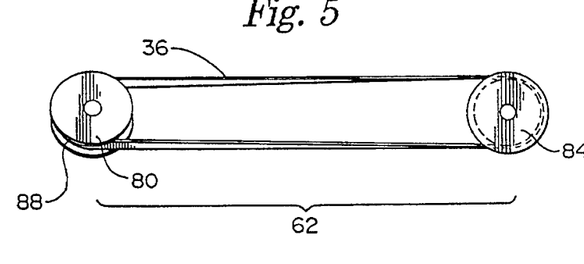
FIG. 5 is an end view of alternate embodiment rollers generally according to the configuration of FIG. 3.
Figure 6:
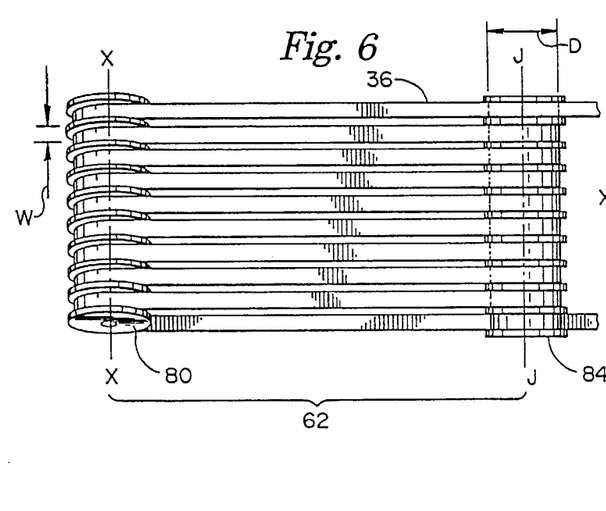
FIG. 6 is a plan view of the components depicted in FIG. 5 which comprise an alternate embodiment combination of a segmented roller in cooperation with a tilted segmented roller.
Figure 7:
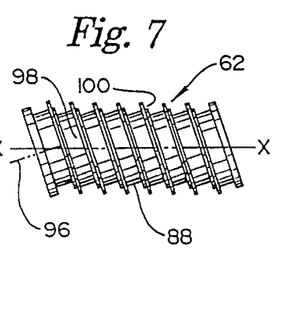
FIG. 7 is a side elevation view of a segmented tilted roller.
Figure 8:
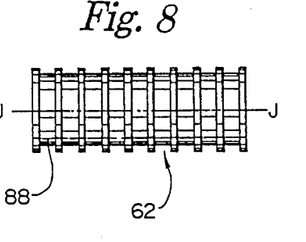
FIG. 8 is a side elevation view of a segmented roller.

FIGS. 5–8 disclose configurations of tape transfer means 62. Referring to FIG. 5, an end view illustrates a configuration wherein tape transfer means 62 comprises a first transfer mechanism 80 and a second transfer mechanism 84. Either, or both, first transfer mechanism 80 and second transfer mechanism 84 may comprise means for continuous feed and receipt of tape substrate 36. First transfer mechanism 80 may comprise a roller, and such roller may further comprise a plurality of segments 88 constructed and arranged for receipt and transfer of tape substrate 36. A segmented roller such as first transfer mechanism 80 may, but need not have to, comprise segments 88 which may be independently operable and which may comprise a common axis of rotation J—J, as shown in FIG. 8.

Segments 88, which in the aggregate form a segmented roller, may further be assembled to form a plurality of tilted rollers, as most readily seen in FIG. 7. Each roller segment 88 may further comprise an independent axis of rotation 96 which is oriented at an acute angle relative to a common axis X—X passing through the midpoint of each segmented roller. In this manner, the roller having tilted segments 88 cooperates with second transfer mechanism 84 so that the web substrate must twist as it moves between the relatively tilted transfer mechanisms. Accordingly, web substrate 36 does not experience the sliding or walking effect which it otherwise would if only rollers in a conventional sense were used as transfer mechanisms. Edge guide means 100 is provided to further control the tape substrate at the sides of each tape substrate contacting surface 98. Referring again to FIG. 6, tape transfer means 62 is shown in the process of transferring tape substrate 36 between first transfer mechanism 80 and second transfer mechanism 84.

Figure 9:
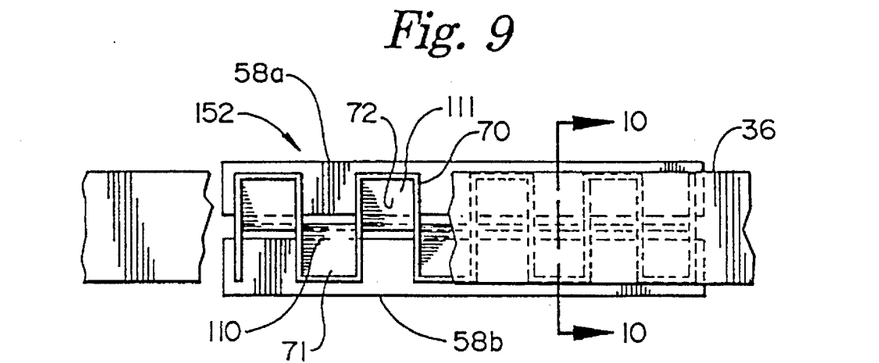
FIG. 9 is a plan view of an alternate embodiment of the present system invention for a straight pass deposition system.

In FIG. 9, an alternate embodiment device 152 according to the present system invention is disclosed. FIG. 9 exemplifies a straight pass system of source material deposition onto a tape or web substrate. This novel operation is accomplished by providing conventional tape transfer means for imparting continuous movement of tape substrate 36 past any suitable plurality of source materials, for example, 58a, 58b. Source materials 58a, 58b are positioned at a plurality of locations suitable for physical vapor deposition onto tape substrate 36. Deposition source materials are preferably, but not solely, located beneath the level at which tape substrate 36 is supported and transferred by tape transfer means. Shielding means 70 is configured in a baffle or screen pattern of alternating deposition flux paths 71, 72 for permitting deposition of the source material vapor fluxes 16a, 16b in a serial manner on tape substrate 36.

Figure 10:
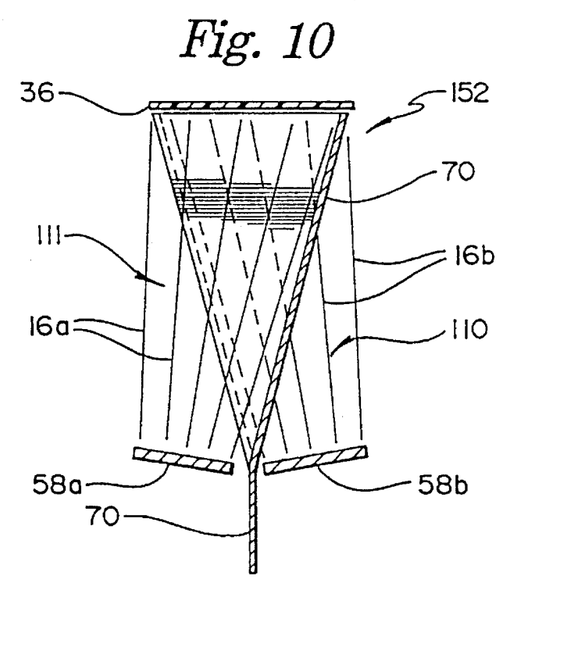
FIG. 10 is an end view of the system depicted in FIG. 9.

FIG. 10 is a sectional elevation view taken along lines 10—10 of FIG. 9. FIG. 10 further illustrates the relation of shielding means 70 configured to provide a plurality of deposition source material chambers 110, 111 in a linear path so that source materials are deposited on tape substrate 36 as the tape transfer means moves tape substrate 36 in a continuous single path movement over the source materials. System 152 provides yet another embodiment of an efficient system and method for depositing a multilayered structure onto a web or tape substrate. Such systems permit a very high coating rate, low cost per unit area, and uniform magnetic properties of the resulting structure.

An exemplary product manufactured according to the various methods and structural systems disclosed herein comprises an elongated web or tape substrate having a multilayered structure. Indeed, such a thin film article is, of itself, unique. Although some references are made to multilayered structures on disk substrates, the teachings of such references do not solve the problems of, nor are they obvious to, applications in the tape media field. Therefore, this invention contemplates a multilayer narrow web thin film comprising a narrow width web substrate suitable for receiving multiple layers of deposition source materials. The deposition comprises a plurality of layers of deposition source materials deposited in a continuous manner onto the web substrate. These layers, shown representatively in FIG. 2 as layers 44, 45 comprising layering 40, are deposited onto tape or web substrate 36 so that the number of layers exceeds the number of deposition sources. The various layers combine to exhibit the excellent thin film properties indicative of layers which have been vacuum deposited in a continuous manner. For example, in the case of magnetic thin film, the multilayered structure produces superb thin film magnetic characteristics with regard to coercivity, anisotropy, magnetization, and the like. The deposited layers may comprise either organic or inorganic, or a combined organic/inorganic composition.

Figure 11:
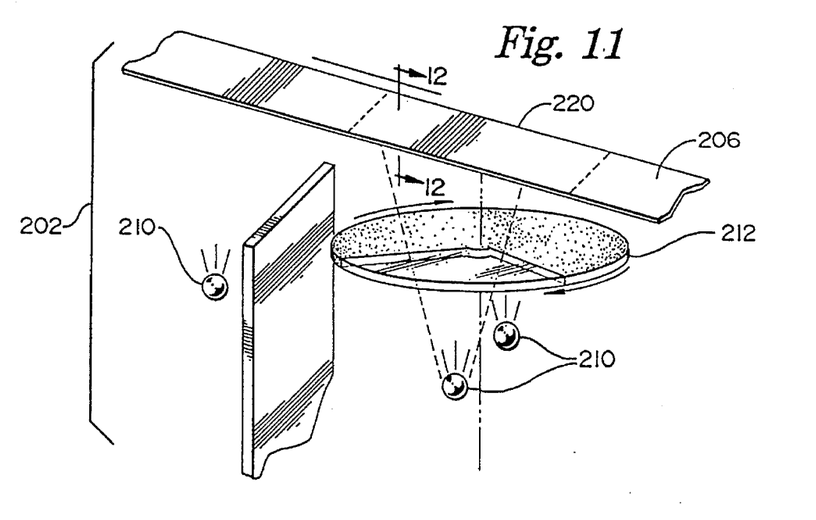
FIG. 11 is a perspective schematic view of a continuous reel-to-reel single pass deposition system using a rotatable shutter.

FIG. 11 is a schematic view of another embodiment of a device for manufacturing a tape or web substrate article having a multilayered coating according to the invention. This embodiment discloses a continuous single-pass deposition system 202 for producing multilayer structured thin films on a web substrate. Operation of system 202 comprises transporting web 206 past a configuration of shuttered deposition sources 210. Sources 210 are preferably arranged for uniform layer deposition during the time of source exposure. Appropriate shielding may be necessary to prevent cross contamination or to isolate sources from one another. This can be accomplished with a modified conventional reel-to-reel web transport system. By cycling a shutter 212 in a periodic fashion, layers are deposited in sequence from each of the sources to produce a multilayer-structured film on a web substrate as the substrate or web 206 passes the sources. A unitary composition substrate or web is preferred, but such web may also be functional as a carrier for other substrates, for example, disk shaped substrates.

Use of this process results in a sequential exposure of a length of the substrate to deposition source material fluxes. Consequently, the process provides a sequential deposition of source materials onto a length of the substrate. The alternating and periodic manner of vapor deposition permits the number of alternating source exposures to be greater than the number of sources. A preferred ratio of exposures to sources is greater than 1:1, with a more preferred ratio greater than 2:1. Exposure to source ratios of greater than about 4:1 and about 10:1 are also feasible and desired within the scope of this invention.

Figure 12:
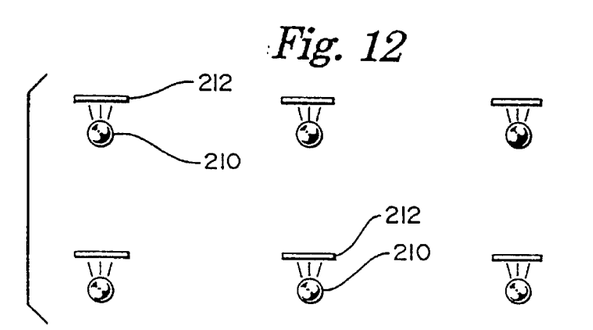
FIG. 12 is a schematic view of a portion of a continuous single pass deposition system depicting a plurality of individually shutterable sources.
Figure 13:
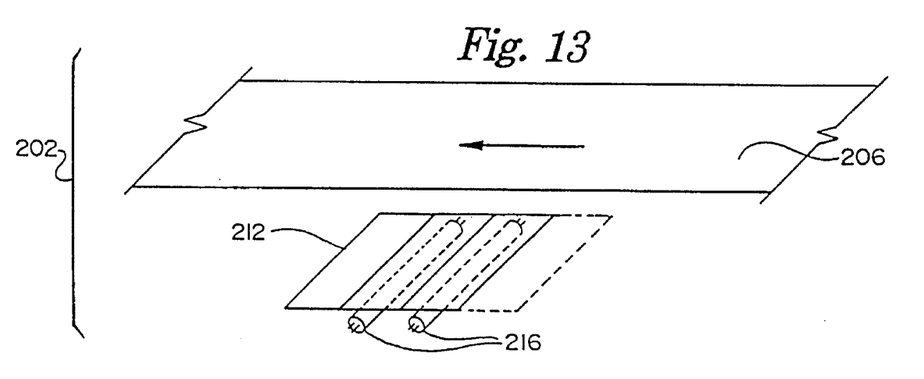
FIG. 13 is schematic view of a continuous single pass deposition system using elongated sources and ganged shutters.

Shutter 212 is preferably a chopper-like shutter as shown in FIG. 11. However, alternate shutter configurations comprise a plurality of individually controlled shutters 212 as shown in FIG. 12, or a ganged shutter as shown in FIG. 13. The ganged shutter of FIG. 13 is particularly useful for elongated sources 216. The configuration of a shutter, its speed of motion, and its geometry, determines the exposure time and the frequency of exposure of each of the deposition sources as the substrate passes an exposure region. The exposure region is where a designated portion or length of the substrate, such as portion 220 shown in FIG. 11, experiences vapor deposition from the sources. Other factors critical to successful deposition include the rate of the source deposition, the tape transport speed, the size and adjustability of aperture openings, and the type of source. In depositions where it is desired to provide a monolayer or less thickness of a material, then the invention using the chopper-like shutter is most useful. This is due in part to the excellent control of deposition rates which is possible with the shutter configuration of this embodiment, and the resulting superior composition control.

Use of the embodiments shown in FIGS. 11, 12, and 13, result in multilayered films which have layers that are slightly inclined to the web surface. The amount of inclination depends on the relative layer thicknesses and the amount of time between exposures. For example, assume that the web is alternately exposed to two different deposition sources through a single aperture which is placed close to the web. Also assume that there is no time between source exposures, that the deposition rates from a first source and a second source are $r_1$ and $r_2$ respectively, the web speed is v, and the exposure times for both sources is t. Then the angle of inclination of the layers to the web at any given point will be either $\tan^{-1}(r_1/v)$ or $\tan^{-1}(r_2/v)$, and it will switch between these two angles with a spatial period (down-web) of vt.

The processes of this invention are particularly useful in the manufacture of articles having tunable magnetic properties. Such articles include magnetic and magneto-optical tape. The processes also permit greater ease in deposition of a variety of material combinations previously recognized as difficult to use. Manufacturing according to the above methods affords improved composition control. These processes are also useful in manufacturing articles which increase research and development productivity.

EXAMPLE 1

Using the embodiment of FIG. 11, operation of a laboratory scale system for coating multilayer structures onto a narrow web in a single pass, continuous process was performed. In a high vacuum system, a reel-to-reel tape transport was used to transport tape over a sequence of two electron beam evaporation source configurations. Shielding was provided so that any point on the web was exposed to only one source configuration at a time. One of these configurations consisted of two electron gun sources located about 8 inches (20 centimeters) below the plane of the web, mounted symmetrically about a plane normal to, and bisecting the web. A chopper-like shutter was placed central to, and above, the two electron gun sources. One source was for platinum deposition, and the other source was for cobalt deposition. Upon spinning, the shutter functioned to alternately expose the web to each of the two electron gun sources. The deposition rates of each of the electron gun sources were independently monitored and were used as feedback to maintain constant deposition rates. By setting the electron gun source deposition rates, the shutter speed of rotation, and the web transport speed, the thickness of the layers in the multilayer structure and the total thickness of the multilayer structure were varied as desired. In this example, cobalt layer thicknesses were varied between 3 angstroms and 6 angstroms, while the platinum layer thickness was held constant at 10 angstroms. Then, the platinum layer thickness was varied between 8 angstroms and 12 angstroms while the cobalt layer thickness was held constant at 4 angstroms. About 16 layers each of platinum and cobalt were deposited in each length of these platinum/cobalt multilayer structured thin films. In this example, the other of the two electron gun source configurations consisted of a single 4-pocket electron gun source situated directly below the center of the web. This electron gun source was used to deposit layers of other materials under, or over, the multilayered film as desired to create dielectric layers, environmental layers, or the like.

EXAMPLE 2

Figure 14:
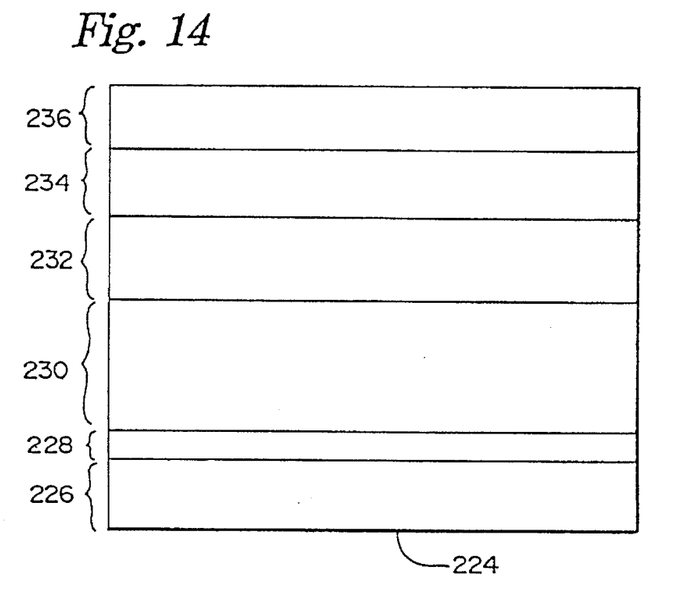
FIG. 14 is a schematic cross section of a magneto-optical thin film stack produced using the system of FIG. 11.
Figure 15:
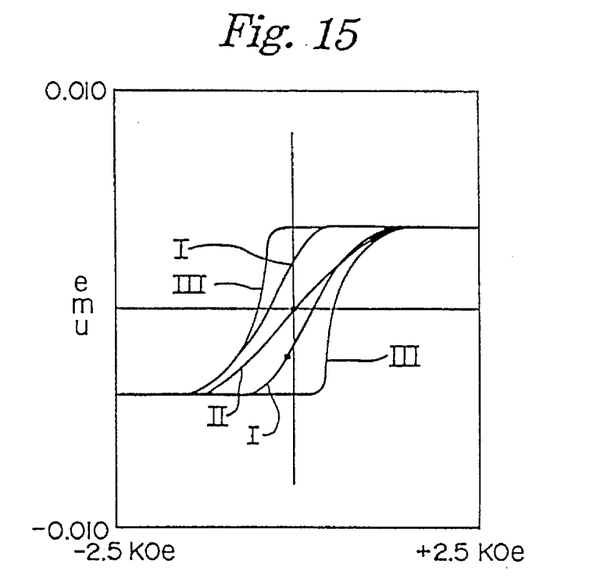
FIG. 15 is a plot of magnetization states of the article of manufacture shown in FIG. 14, with comparative curves for alternate remanence valves.

FIG. 14 shows a magneto-optical thin film stack 224 produced by the method described in Example 1. On a 1 inch (2.54 centimeter) wide polyamide tape substrate 226, there was formed, in order, a 100 angstroms thick layer 228 of chromium, a 400 angstroms thick layer 230 of aluminum, a 250 angstroms thick layer 232 of silicon, a 200 angstroms thick layer 234 of multi-structured platinum/cobalt, and a 200 angstroms thick layer 236 of silicon. The multi-structured platinum/cobalt layer 234 consists of alternating paired layers each having 10 angstroms of platinum and 4 angstroms of cobalt. M(H) measurements indicated that the magnetic properties were substantially uniform over the entire length of the tape. A representative M(H) loop from a sample of the tape is shown in FIG. 15 as loop III, representing a 100% remanence value. Loop I and loop II, representing remanence values of about 50% and 0% are shown for comparison. The reflectivity of the thin film stack at 780 nanometers wavelength was 29%. The tape with the magneto-optical stack deposited onto it retained a flat profile, indicating the level of stress in the film was insufficient to make the film-substrate combination curl.

What is claimed is:

1. A method for sequential deposition of source materials onto a surface of a web substrate by a deposition apparatus enclosing a plurality of deposition sources, the length of said web substrate being longer than the largest dimension of said apparatus, said method comprising the steps of:

a) providing a web substrate transfer means for imparting continuous movement or said web substrate from a web substrate feeding means past said plurality of deposition sources to a web substrate receiving means;

b) positioning said plurality of deposition sources facing said web substrate as said web substrate passes said plurality of deposition sources; and c) operating said web substrate transfer means to continuously move said web substrate from said web substrate feeding means to said web substrate receiving means such that as said web substrate passes said plurality of deposition sources, of at least two different deposition source materials are applied to said web substrate in an alternating periodic manner by vapor deposition from said plurality of deposition sources, so that substantially the full length of said web substrate surface is exposed to deposition fluxes from said plurality of deposition sources, the number of alternating source exposures being greater than the number of said plurality of deposition sources.

2. The method of claim 1, wherein the deposition of said source materials is conducted so that at least one of said source exposures deposits less than a full monolayer of source material.

3. A continuous coating method for depositing a multilayered structure onto a web substrate by a deposition apparatus enclosing a plurality of deposition sources, the length of said web substrate being longer than the largest dimension of said enclosure, said method comprising the steps of:

a) providing a web substrate transfer means for imparting continuous movement of said web substrate from a web substrate feeding means past said plurality of deposition sources to a web substrate receiving means;

b) positioning said plurality of deposition sources facing said web substrate supported by said web substrate transfer means as said substrate passes said plurality of deposition sources; and c) operating said web substrate transfer means to continuously move said web substrate from said web substrate feeding means to said web substrate receiving means such that as said web substrate passes said plurality of deposition sources, deposition source materials are applied to said web substrate by vapor deposition from said plurality of deposition sources to produce a multilayered structure on said web substrate, the number or layers being, greater than the number of said plurality of deposition sources.

* * * * *

UNITED STATES PATENT AND TRADEMARK OFFICE
CERTIFICATE OF CORRECTION

PATENT NO. : 5,460,853

DATED : October 24, 1995

INVENTOR(S) : Michael B. Hintz, Joseph H. Sexton, William C. Mitchell and John W. Ulseth It is certified that error appears in the above-indentified patent and that said Letters Patent is hereby corrected as shown below:

Column 8, line 51, "of at least" should read --at least--.

Column 10, line 7, "or" should read --of--.

Column 10, line 8, "being, greater" should read --being greater--.

Signed and Sealed this

Thirtieth Day of April, 1996

Attest:

BRUCE LEHMAN

Attesting Officer

Commissioner of Patents and Trademarks